(12) United States Patent
Wu et al.

(10) Patent No.: US 7,265,038 B2
(45) Date of Patent: Sep. 4, 2007

(54) METHOD FOR FORMING A MULTI-LAYER SEED LAYER FOR IMPROVED CU ECP

(75) Inventors: Ping-Kun Wu, Chang-Hua (TW); Horng-Huei Tseng, Hsinchu (TW); Chine-Gie Lo, Hsinchu Hsien (TW); Chao-Hsiung Wang, Hsinchu (TW); Shau-Lin Shue, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/723,509

(22) Filed: Nov. 25, 2003

(65) Prior Publication Data

US 2005/0110147 A1 May 26, 2005

(51) Int. Cl.
    *H01L 21/26* (2006.01)
(52) U.S. Cl. .................. 438/513; 438/647; 438/643; 438/653; 438/798
(58) Field of Classification Search ............... 438/631, 438/633, 637, 643, 645, 648, 653, 680, 683, 438/692, 700
    See application file for complete search history.

(56) References Cited

U.S. PATENT DOCUMENTS

| | | | | |
|---|---|---|---|---|
| 6,037,258 A | * | 3/2000 | Liu et al. | 438/687 |
| 6,093,966 A | * | 7/2000 | Venkatraman et al. | 257/751 |
| 6,136,707 A | * | 10/2000 | Cohen | 438/687 |
| 6,291,333 B1 | * | 9/2001 | Lou | 438/618 |
| 6,297,158 B1 | * | 10/2001 | Liu et al. | 438/687 |
| 6,303,490 B1 | * | 10/2001 | Jeng | 438/627 |
| 6,342,448 B1 | * | 1/2002 | Lin et al. | 438/687 |
| 6,518,668 B2 | * | 2/2003 | Cohen | 257/751 |
| 6,610,151 B1 | * | 8/2003 | Cohen | 118/719 |
| 6,624,516 B2 | * | 9/2003 | Fujisawa et al. | 257/762 |
| 6,767,788 B2 | * | 7/2004 | Kim | 438/253 |
| 6,780,769 B2 | * | 8/2004 | Fujisawa et al. | 438/687 |
| 6,841,468 B2 | * | 1/2005 | Friedemann et al. | 438/627 |
| 6,878,615 B2 | * | 4/2005 | Tsai et al. | 438/618 |
| 2002/0041028 A1 | * | 4/2002 | Choi et al. | 257/751 |
| 2003/0057526 A1 | * | 3/2003 | Chung et al. | 257/642 |

FOREIGN PATENT DOCUMENTS

JP        2000183064 A   *  6/2000

* cited by examiner

*Primary Examiner*—Alonzo Chambliss
(74) *Attorney, Agent, or Firm*—Tung & Associates

(57) ABSTRACT

A copper filled damascene structure and method for forming the same the method including providing a substrate comprising a semiconductor substrate; forming an insulator layer on the substrate; forming a damascene opening through a thickness portion of the insulator layer; forming a diffusion barrier layer to line the damascene opening; forming a first seed layer overlying the diffusion barrier; plasma treating the first seed layer in-situ with a first treatment plasma comprising plasma source gases selected from the group consisting of argon, nitrogen, hydrogen, and $NH_3$; forming a second seed layer overlying the first seed layer; forming a copper layer overlying the second seed layer according to an electro-chemical plating (ECP) process to fill the damascene opening; and, planarizing the copper layer to form a metal interconnect structure.

40 Claims, 2 Drawing Sheets

METHOD FOR FORMING A MULTI-LAYER SEED LAYER FOR IMPROVED CU ECP

FIELD OF THE INVENTION

This invention generally relates to semiconductor device manufacturing methods and more particularly to a method for forming copper damascenes within low-K dielectric insulating layers including forming a multi-layer seed layer to improve a copper ECP process to fill a copper damascene.

BACKGROUND OF THE INVENTION

In forming damascene structures in integrated circuit manufacturing processes, the surface condition of the damascene opening is critical for achieving acceptable adhesion and coverage of overlying layers. The damascene opening, for example a dual damascene opening is formed in an inter-metal dielectric (IMD) insulating layer by a series of photolithographic patterning and etching processes, followed by formation of a barrier layer and overlying metal, e.g., copper, seed layer to promote a copper electro-chemical plating (ECP) deposition process.

Increasingly, low-K IMD layers are required to reduce signal delay and power loss effects as integrated circuit devices are scaled down. One way this has been accomplished has been to introduce porosity or dopants into the IMD layer. In particular, incorporation of low-K materials with dielectric constants less than about 3.5 has become standard practice as semiconductor feature sizes have diminished to less than 0.2 microns. As feature sizes decrease below about 0.13 microns, for example including 90 nm and 65 nm critical dimension technology materials with dielectric constants less than about 2.5 will be required. In addition, the aspect ratios (height/width) of interconnect openings becomes increasingly large, making continuous coverage of physical vapor deposition (PVD) process more problematical. The phenomena of increasingly porous IMD surfaces and increasingly high aspect ratio openings, either individually or in combination, have created manufacturing limitations that must be overcome to form reliable copper damascenes in smaller critical dimension technologies.

For example, the presence of a relatively rough surface due to the penetration of pore openings at the surface of an opening etched into a low-K IMD layer produces surface micro-openings adversely affecting coverage of overlying deposited layers, for example diffusion barrier layers and seed layers. As a result, thicker barrier layers, with increased series resistance are required in order to avoid forming barrier layers having pinholes which undesirably allow electromigration of metal into the IMD layer. Further, the deposition of seed layers, typically formed by PVD processes, may be non-continuously formed, thereby adversely affecting eletro-chemical deposition processes. For example, non-contiguous seed layers, for example, including as pin holes, can cause the formation of voids within the copper filling portion of an ECP deposited copper layer.

Another problem with PVD copper seed layers is the ready formation of copper oxides over portions of the seed layer surface prior to carrying out the ECP process, further contributing to the formation of voids in the ECP deposited copper layer due to variable deposition rates caused by variable conductivities of the seed layer.

There is therefore a need in the integrated circuit manufacturing art to develop an improved copper seed layer and method of forming the same to improve a copper ECP process to improve performance and reliability of copper damascenes.

It is therefore among the objects of the present invention to provide an improved copper seed layer and method of forming the same to improve a copper ECP process to improve performance and reliability of copper damascenes, while overcoming other shortcomings of the prior art.

SUMMARY OF THE INVENTION

To achieve the foregoing and other objects, and in accordance with the purposes of the present invention, as embodied and broadly described herein, the present invention provides a copper filled damascene structure and method for forming the same to enable void-free copper ECP damascene formation.

In a first embodiment, the method includes providing a substrate comprising a semiconductor substrate; forming an insulator layer on the substrate; forming a damascene opening through a thickness portion of the insulator layer; forming a diffusion barrier layer to line the damascene opening; forming a first seed layer overlying the diffusion barrier; plasma treating the first seed layer in-situ with a first treatment plasma comprising plasma source gases selected from the group consisting of argon, nitrogen, hydrogen, and $NH_3$; forming a second seed layer overlying the first seed layer; forming a copper layer overlying the second seed layer according to an electro-chemical plating (ECP) process to fill the damascene opening; and, planarizing the copper layer to form a metal interconnect structure.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the present invention is explained by reference to an exemplary dual damascene formation process, it will be appreciated that the method of the present invention applies generally to the formation of damascenes including single vias and trench lines extending through single or multiple IMD layers. While the method is particularly advantageous for forming copper damascenes in porous low-K dieiectrics, it will be appreciated that the method may be applied to the formation of other metal damascenes and other dielectric insulating layers, particularly where damascene opening aspect ratios are greater than about 4, where the method of the present invention will advantageously improve step coverage of seed layers to improve a copper ECP process.

By the term damascene is meant any damascene interconnect structure both e.g., both single and dual damascenes, including vias, contact openings, and trench lines. Further, the term 'copper' will be understood to include copper and alloys thereof.

For example, in an exemplary implementation of the method of the present invention and exemplary damascene structure formed thereby, referring to FIGS. 1A-1E, are shown cross sectional views of a portion of a multi-level semiconductor device at stages in an integrated circuit manufacturing process.

Figure 1A:
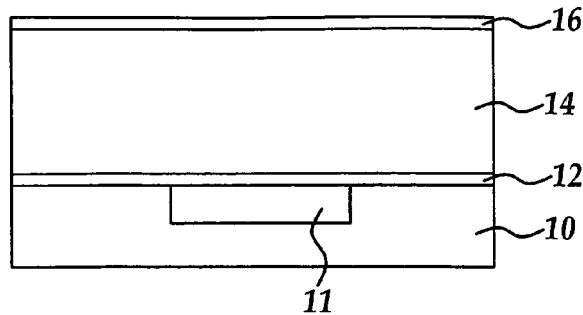
FIGS. 1A to 1E are cross sectional views of an exemplary damascene structure at stages of manufacture according to an embodiment of the invention.

Referring to FIG. 1A, a substrate including for example metal interconnect portion 11, is formed in a dielectric insulating layer 10 by conventional processes known in the micro-electronic integrated circuit manufacturing art followed by deposition of an overlying first etching stop layer 12, for example, silicon nitride (e.g., SiN, $Si_3N_4$) or silicon carbide (e.g., SiC) to a thickness of about 300 Angstroms to about 700 Angstroms by conventional (CVD processes, for example, LPCVD or PECVD.

Still referring to FIG. 1A, formed over first etching stop layer 12 is dielectric insulating layer 14, for example an inter-metal dielectric (IMD) layer, preferably formed of a low-K dielectric material, for example a silicon oxide based material having a porous structure. By the term 'low-K dielectric' is meant having a dielectric constant less than about 3.0, preferably less than about 2.7. The dielectric insulating layer portion 14, in one embodiment is preferably formed by a CVD process, for example LPCVD or PECVD including organo-silane precursors such methylsilanes, including tetramethylsilane and trimethylsilane. In addition, organo-siloxane precursors such as cyclo-tetra-siloxanes such as tetramethylcyclotetrasiloxane, octamethylcyclotetrasiloxane, and decamethylcyclopentasiloxane may be suitably used to form the IMD layer portion 14. It will be appreciated that inorganic or organic spin-on glasses (SOG) may also be used, for example including organo-silane or organo-siloxane precursors which are spun on the substrate by conventional methods followed by a curing process including optional post curing thermal and plasma treatments.

Although not shown, a middle etch stop layer, for example formed of silicon nitride, silicon oxynitride, silicon carbide, or silicon oxycarbide may be formed in the middle portion of IMD layer 14 to separate an upper trench line portion and a lower via portion of the IMD layer in a completed dual damascene structure.

Still referring to FIG. 1A, one or more hardmask/ARC layers e.g., layer 16, preferably a single inorganic layer functioning as both a hard mask and a bottom anti-reflective coating (ARC), for example preferably formed of silicon oxynitride, or silicon oxycarbide, is provided over the IMD layer 14 at an appropriate thickness, to minimize light reflectance from the IMD layer surface in a subsequent photolithographic patterning process.

Figure 1B:
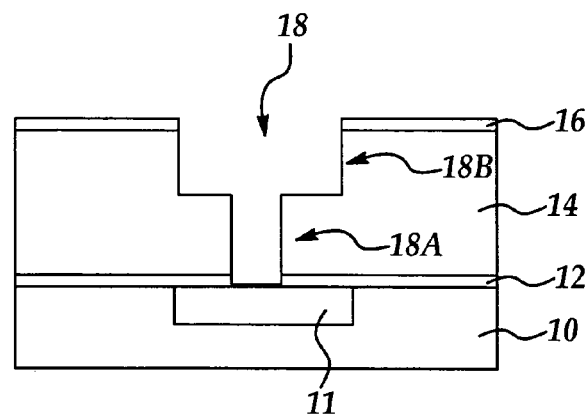

Referring to FIG. 1B, conventional photolithographic and etching processes are then carried out to form a dual damascene opening 18. For example a first via opening is formed by first dry etching through the hardmask/ARC layer e.g., 16 followed by dry etching through the thickness of the IMD layer 14, using conventional dry (e.g., reactive ion etch) etching chemistries to form a via opening portion e.g., 18A, followed by a similar lithographic and etching process to form a trench opening portion e.g., 18B overlying one or more via openings e.g., 18A.

Figure 1C:
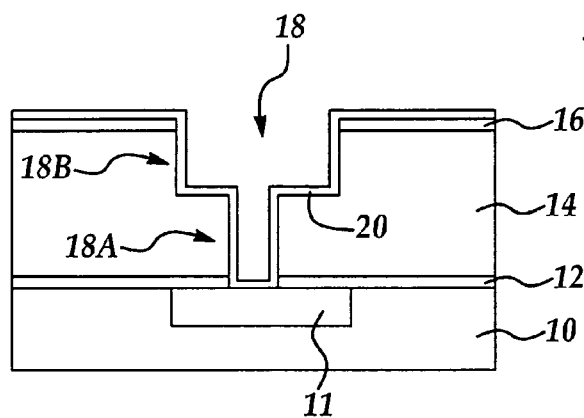

Referring to FIG. 1C, according to an aspect of the invention a diffusion barrier layer e.g., 20 is blanket deposited to line the damascene opening (including overlying an exposed portion of metal interconnect e.g., 11 at a bottom portion. The diffusion barrier layer is preferably deposited by one of a CVD, PVD, ion metal plasma (IMP), and self-ionized plasma (SIP). The diffusion barrier layer preferably includes at least one layer of Ta, TaN, Ti, TiN, WN, Cr, CrN, TaSiN, TiSiN, and WSiN, deposited to a thickness of about 100 to about 500 Angstroms. In a preferred embodiment, the barrier layer 20 is Ta/TaN, TaN or TaSiN, most preferably a dual layer of Ta/TaN.

Figure 1D:
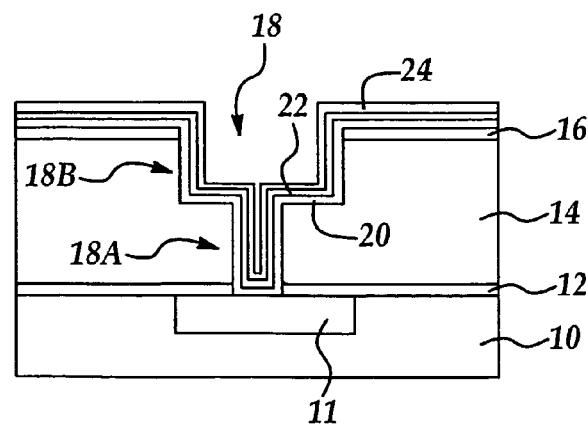

Referring to FIG. 1D, in an important aspect of the invention, a first seed layer 22 is deposited on the diffusion barrier layer to a thickness of about 50 Angstroms to about 300 Angstroms. In one embodiment, the first seed layer 22 is deposited to form a substantially non-conformal layer. The term 'substantially non-conformal' means that the sidewalls and/or bottom portion of the opening receive less than about 10% of the deposited coverage (thickness) compared to the substrate process surface. To deposit the substantially non-conformal seed layer, a PVD process is preferred. In another embodiment, the first seed layer 22 is deposited (e.g., blanket deposited) to form a substantially conformal layer. The term 'substantially conformal' means that the sidewalls and/or bottom portion of the opening receive greater than about 10% of the deposited coverage (thickness) compared to the substrate process surface. To deposit the substantially conformal seed layer, one of a CVD, IMP, SIP, and electroless process is preferred. Preferably the first seed layer 22 is formed of one of Cu, Ti, TiN, Ta, TaN, Cr, CrN, W, and WN. In a preferred embodiment, the first seed layer is copper. It will be appreciated that the metal nitrides as listed are intended to include other stoichiometries of both metal and nitrogen different from 1 including e.g., TiNx, TaNx, CrNx, where x as different from 1, e.g., greater than 1.

In another important aspect of the invention, following deposition of the first seed layer 22, the first seed layer is treated with an oxygen-free plasma including at least one of argon (Ar), nitrogen ($N_2$), ammonia ($NH_3$), and hydrogen ($H_2$) to form a substantially oxide-free first seed layer surface. More preferably, the first seed layer is treated by a plasma composed essentially (supplied by plasma source gases) of one of argon (Ar), nitrogen ($N_2$), ammonia ($NH_3$), and a nitrogen/hydrogen ($N_2/H_2$) mixture. For example, in a preferred treatment, the volumetric ratio of $N_2$ to $H_2$ in the plasma source gas mixture supplied to form the seed layer plasma treatment plasma may range from about 10 to 1 to about 1 to 10. The first seed layer plasma treatment is preferably carried out in-situ with respect to the first seed layer deposition.

The term "in-situ" is meant to include carrying out the subsequent process in the same reactor chamber or a different reactor chamber included in a cluster tool, for example transferred to a separate reactor chamber in the cluster to carry out the first seed layer plasma treatment process, the cluster tool ambient preferably including a controlled ambient environment, preferably substantially free of oxygen (or air) and moisture, to avoid oxidation of the first seed layer. Advantageously, the plasma treatment serves to reduce (remove) any oxides formed on the seed layer, preferably forming a substantially oxide-free seed layer surface. By the term "substantially oxide-free" is meant that greater than about 90% of the seed layer surface is essentially free of oxides.

Still referring to FIG. 1D, in yet a further important aspect of the present invention, following the first seed layer plasma treatment a second seed layer 24 is deposited on the first seed layer, preferably in-situ with respect to the first seed layer plasma treatment to avoid subsequent oxidation of the first seed layer 22. The second seed layer 24 is preferably formed of one of Cu, Ti, TiN, Ta, TaN, Cr, CrN, W, and WN; the same preferred materials listed for the first seed layer 22, but may be the same or different material as the first seed layer 22.

In a preferred embodiment, the second seed layer is copper. The second seed layer 24 is preferably deposited to be substantially conformal if the first layer 22 is substantially non-conformal, e.g., by using one of a CVD, IMP, SIP, and a electroless deposition process, and is preferably deposited to be substantially non-conformal if the first seed layer 22 is substantially conformal, e.g., by using a PVD deposition process. In a preferred embodiment, the first seed layer 22 is deposited by one of a CVD, IMP, SIP, or electroless deposition process (e.g., substantially conformal) and the second seed layer 24 is deposited by a PVD deposition process (e.g., substantially non-conformal). The second seed layer 24 is preferably deposited to a thickness of about 100 Angstroms to about 400 Angstroms. In a preferred embodiment at least one of the first and second seed layers, preferably the second seed layer, forms a continuous layer over active areas of the substrate for carrying out a subsequent ECP process. For example, an exclusion area, or electrical contact areas at the process wafer periphery may be free of ECP material due to the method of holding the wafer during the ECP process.

Following deposition of the second seed layer 24, a second plasma treatment process as carried out according to the same preferred embodiments for the first seed layer 22 plasma treatment process, but may include different or the same plasma source gases, e.g., Ar, $N_2$, $NH_3$, or $N_2/H_2$. Preferably, the second seed layer plasma treatment is carried out in-situ with respect to the deposition of the second seed layer for the same reasons outlined for preferably carrying out the first seed layer plasma treatment in-situ, and is preferably formed substantially oxide-free.

Figure 1E:
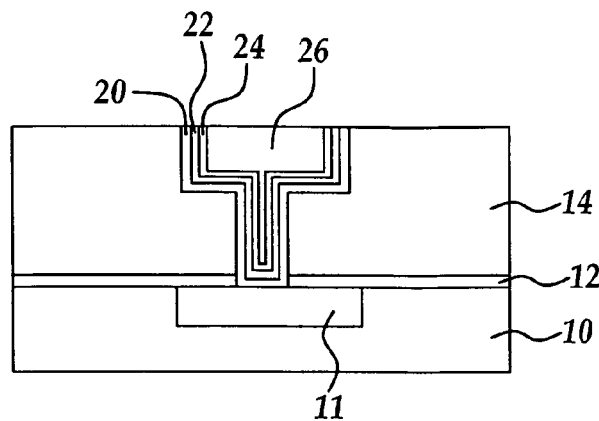

Referring to FIG. 1E, following formation and plasma treatment of the first and second seed layers, a conventional electro-chemical plating (ECP) process is carried out to blanket deposit a copper layer e.g., 26 filling the damascene opening 18. For example, for various types of damascenes, including single and dual damascenes, the copper layer 26 thickness may vary from about 4000 to about 15000 Angstroms. Following copper ECP deposition, a conventional planarization process, for example CMP, is carried out to remove the excess portion of copper layer 26 above the damascene opening level, barrier layer 20, and at least a portion of hardmask/BARC layer 16 to complete the formation of the dual damascene.

Thus, a method and copper damascene structure has been presented including the forming of a multi-layer seed layer has advantageously providing for improved seed layer step coverage of high aspect ratio openings, for example greater than about 4:1 including greater than about 6:1. Furthermore, the method of the present invention is particularly advantageously applied to damascenes including a critical dimension of less than about 0.13 microns, for example including 65 nm and 90 nm critical dimensions. Advantageously, by ensuring formation of a continuous seed layer in high aspect ratio openings, the formation of defects in the RCP process, including voids, are avoided thereby improving the performance and reliability of ECP of copper damascenes. By providing for seed layer plasma treatment processes according to preferred embodiments, the presence of oxides on the seed layer surface is avoided, thereby further avoiding defect formation in the copper ECP process such as voids and further improving the electrical performance and reliability of copper damascenes.

Figure 2:
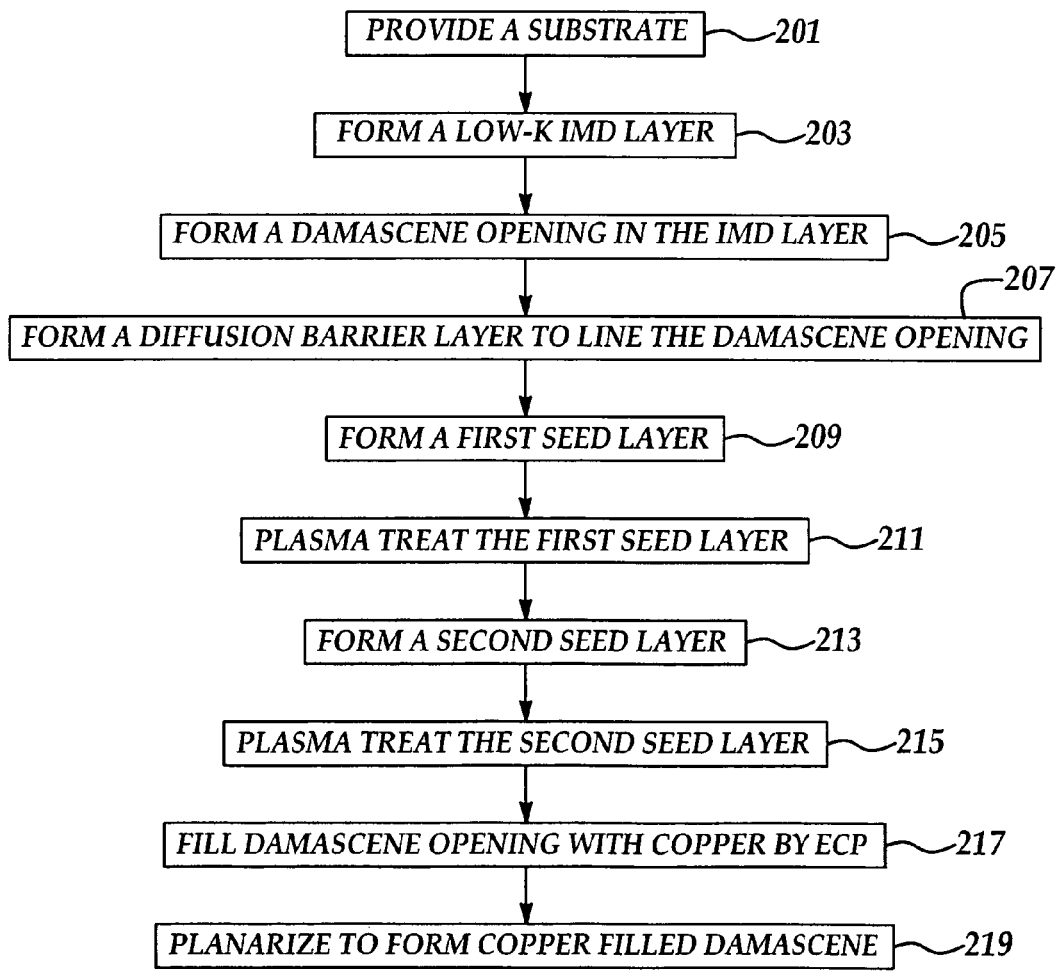
FIG. 2 is a process flow diagram including several embodiments of the present invention.

Referring to FIG. 2 is shown a process flow diagram including several embodiments of the present invention. In process 201, a semiconductor substrate including underlying metal interconnects is provided. In process 203, a low-K IMD layer is formed. In process 205, a damascene opening is formed in the IMD layer. In process 207, a diffusion barrier layer is blanket deposited to line the dual damascene opening according to preferred embodiments. In process 209, a first seed layer is formed according to preferred embodiments over the diffusion barrier layer. In process 211, a first plasma treatment of the first seed layer is carried out according to preferred embodiments. In process 213 a second seed layer is formed according to preferred embodiments over the first seed layer. In process 215, a second plasma treatment of the second seed layer is carried out according to preferred embodiments. In process 217 the damascene is filled with copper by a copper ECP process. In process 219, a planarization process is carried out to form copper filled damascene.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a copper damascene comprising the steps of:
   providing a substrate comprising a semiconductor substrate;
   forming an insulator layer on the substrate;
   forming a damascene opening through a thickness portion of the insulator layer;
   forming a diffusion barrier layer to line the damascene opening;
   then forming a first seed layer on the diffusion barrier;
   then plasma treating the first seed layer in-situ with a first treatment plasma, said first treatment plasma formed from plasma source gases selected from the group consisting of argon, nitrogen, hydrogen, and $NH_3$;
   then forming a second seed layer on the first seed layer;
   forming a copper layer overlying the second seed layer according to an electro-chemical plating (ECP) process to fill the damascene opening; and,
   planarizing the copper layer to form a metal interconnect structure.

2. The method of claim 1, wherein at least one of the first and second seed layers forms a continuous layer over active areas of the substrate.

3. The method of claim 1, wherein at least the second seed layer forms a continuous layer over active areas of the substrate.

4. The method of claim 1, wherein one of the first and second seed layers is substantially nonconformally deposited.

5. The method of claim 1, wherein one of the first and second seed layers is substantially conformally deposited.

6. The method of claim 1, wherein the first seed layer is deposited according to a deposition process selected from the group consisting of CVD, IMP, SIP, and electroless.

7. The method of claim 6, wherein the second seed layer is deposited according to a PVD process.

8. The method of claim 1, wherein the first seed layer is deposited according to a PVD process.

9. The method of claim 8, wherein the second seed layer is deposited according to a deposition process selected from the group consisting of CVD, IMP, SIP, and electroless.

10. The method of claim 1, further comprising the step of plasma treating the second seed layer with a second treatment plasma, said second treatment plasma formed from plasma source gases selected from the group consisting of argon, nitrogen, and hydrogen prior to the step of forming the copper layer.

11. The method of claim 1, wherein the plasma source gases consist essentially of plasma source gases selected from the group consisting of argon (Ar), nitrogen ($N_2$), hydrogen ($H_2$), ammonia ($NH_3$), and a nitrogen/hydrogen ($N_2/H_2$) mixture.

12. The method of claim 1, wherein the first and second seed layers comprise a material selected from the group consisting of Cu, Ti, TiN, Ta, TaN, Cr, CrN, W, and WN.

13. The method of claim 1, wherein at least one of the first and second seed layers is formed of copper or alloy thereof.

14. The method of claim 1, wherein the insulator layer comprises a low-K dielectric insulator having a dielectric constant of less than about 3.0.

15. The method of claim 1, wherein the first seed layer is formed having a thickness of about 50 Angstroms to about 300 Angstroms.

16. The method of claim 1, wherein the second seed layer is formed having a thickness of about 100 Angstroms to about 400 Angstroms.

17. The method of claim 1, wherein the diffusion barrier layer comprises a material selected from the group consisting of Ti, TiN, Ta, TaN, Cr, CrN, W, and WN.

18. The method of claim 1, wherein both the first and second seed layers comprise copper.

19. The method of claim 1, wherein the insulator layer comprises a porous low-K dielectric insulator.

20. A method for forming a copper damascene comprising the steps of:
providing a substrate comprising a semiconductor substrate and metal interconnect structures;
forming a low-K dielectric insulator layer on the substrate;
forming a damascene opening through a thickness portion of the low-K dielectric insulator layer;
forming a diffusion barrier layer to line the damascene opening;
then forming a first seed layer over the diffusion barrier layer;
then plasma treating the first seed layer with a first treatment plasma, said first treatment plasma formed from plasma source gases selected from the group consisting of argon, nitrogen, hydrogen, and $NH_3$;
then forming a second seed layer on the first seed layer;
then plasma treating the second seed layer with a second treatment plasma, said second treatment plasma formed from plasma source gases selected from the group consisting of argon, nitrogen, hydrogen, and $NH_3$;
forming a copper layer over the second seed layer according to an electro-chemical plating (ECP) process to fill the damascene opening; and,
planarizing the copper layer to form a metal interconnect structure.

21. The method of claim 20, wherein the first seed layer is deposited according to a deposition process selected from the group consisting of CVD, IMP, SIP, and electroless.

22. The method of claim 21, wherein the second seed layer is deposited according to a PVD process.

23. The method of claim 20, wherein the first seed layer is deposited according to a PVD process.

24. The method of claim 23, wherein the second seed layer is deposited according to a deposition process selected from the group consisting of CVD, IMP, SIP, and electroless.

25. The method of claim 20, wherein the first and second plasma treatments are formed of plasma source gases selected from the group consisting of argon (Ar), nitrogen ($N_2$), hydrogen ($H_2$), ammonia ($NH_3$), and a nitrogen/hydrogen ($N_2/H_2$) mixture.

26. The method of claim 20, wherein the first and second seed layers comprise a material selected from the group consisting of Cu, Ti, TiN, Ta, TaN, Cr, CrN, W, and WN.

27. The method of claim 20, wherein at least one of the first and second seed layers is formed of copper or alloy thereof.

28. The method of claim 20, wherein the low-K dielectric comprises a dielectric constant of less than about 3.0.

29. The method of claim 20, wherein the first seed layer is formed having a thickness of about 50 Angstroms to about 300 Angstroms.

30. The method of claim 20, wherein the second seed layer is formed having a thickness of about 100 Angstroms to about 400 Angstroms.

31. The method of claim 20, wherein the diffusion barrier layer comprises a material selected from the group consisting of Ti, TiN, Ta, TaN, Cr, CrN, W, and WN.

32. The method of claim 20, wherein both the first and second seed layers comprise copper.

33. The method of claim 20, wherein the insulator layer comprises a porous low-K dielectric insulator.

34. A method for forming a copper damascene seed layer with improved seed layer step coverage to reduce void formation during ECP comprising the steps of:
providing a damascene opening formed in a porous insulating substrate;
forming a diffusion barrier layer to line the damascene opening;
then forming a first seed layer on the diffusion barrier;
then plasma treating the first seed layer in-situ with a first treatment plasma without depositing a material layer, said first treatment plasma formed from plasma source gases selected from the group consisting of argon, nitrogen, hydrogen, and $NH_3$;
then forming a second seed layer on the first seed layer;
then plasma treating the second seed layer in-situ with a second treatment plasma without depositing a material layer, said second treatment plasma formed from plasma source gases selected from the group consisting of argon, nitrogen, hydrogen, and $NH_3$; and,
depositing a copper layer on the second seed layer according to ECP to fill the damascene opening.

35. The method of claim 34, wherein the first and second plasma treatments are formed from plasma source gases selected from the group consisting of argon (Ar), nitrogen ($N_2$), hydrogen ($H_2$), ammonia ($NH_3$), and a nitrogen/hydrogen ($N_2/H_2$) mixture.

36. The method of claim 34, wherein the porous insulating layer comprises a low-K dielectric having a dielectric constant of less than about 3.0.

37. The method of claim 34, wherein the first seed layer is formed having a thickness of about 50 Angstroms to about 300 Angstroms.

38. The method of claim 34, wherein the second seed layer is formed having a thickness of about 100 Angstroms to about 400 Angstroms.

39. The method of claim 34, wherein the first and second seed layers are substantially oxide free prior to deposition of the copper layer.

40. The method of claim 34, wherein the first and second seed layers comprise copper.

* * * * *